(12) United States Patent
Cheeranthodi et al.

(10) Patent No.: US 8,872,587 B2
(45) Date of Patent: Oct. 28, 2014

(54) GENERATING NEGATIVE IMPEDANCE COMPENSATION

(71) Applicant: International Business Machines Corporation, Armonk, NY (US)

(72) Inventors: Rajesh Cheeranthodi, Kerala (IN); John F. Ewen, Rochester, MN (US); Santhosh Madhavan, Bangalore (IN); Giri N. K. Rangan, Bangalore (IN); Umesh K. Shukla, Bangalore (IN); Sarabjeet Singh, Bangalore (IN)

(73) Assignee: International Business Machines Corporation, Armonk, NY (US)

(*) Notice: Subject to any disclaimer, the term of this patent is extended or adjusted under 35 U.S.C. 154(b) by 49 days.

(21) Appl. No.: 13/786,624

(22) Filed: Mar. 6, 2013

(65) Prior Publication Data

US 2014/0253236 A1    Sep. 11, 2014

(51) Int. Cl.
*H03F 3/45* (2006.01)
*H03F 1/08* (2006.01)

(52) U.S. Cl.
CPC ............ *H03F 1/086* (2013.01); *H03F 3/45179* (2013.01)
USPC .......................................... 330/254; 330/252

(58) Field of Classification Search
USPC .................... 330/254, 253, 252, 69
See application file for complete search history.

(56) References Cited

U.S. PATENT DOCUMENTS

| | | | | |
|---|---|---|---|---|
| 4,547,744 A | * | 10/1985 | Kasperkovitz | 330/261 |
| 6,788,141 B2 | * | 9/2004 | Paul et al. | 330/252 |
| 7,202,740 B2 | * | 4/2007 | Leete | 330/254 |
| 7,432,763 B2 | * | 10/2008 | Leete | 330/254 |
| 7,548,094 B2 | | 6/2009 | Shepard et al. | |
| 7,961,050 B1 | * | 6/2011 | Swei et al. | 330/304 |
| 2002/0044018 A1 | * | 4/2002 | Dupuis et al. | 330/254 |
| 2013/0314156 A1 | * | 11/2013 | Kao et al. | 330/254 |

FOREIGN PATENT DOCUMENTS

JP    2005286516 A    10/2005

OTHER PUBLICATIONS

Jungwon Han, Kwisung Yoo, Dongmyung Lee, Kangyeop Park, Wonseok Oh, Sung Min Park, "A Low-Power Gigabit CMOS Limiting Amplifier Using Negative Impedance Compensation and Its Application" IEEE Transactions on Very Large Scale Integration (VLSI) Systems 2011.
Sherif Galal, Behzad Razavi, "10-Gb/s Limiting Amplifier and Laser/Modulator Driver in 0.18 um CMOS Technology" IEEE Journal of Solid-State Circuits, vol. 38, No. 12, Dec. 2003.
David J. Comer, Donald T. Comer, Jonathan B. Perkins, Kevin D. Clark, Adrian P. C. Genz "Bandwidth Extension of High-Gain CMOS Stages Using Active Negative Capacitance" Electronics, Circuits and Systems, 2006. ICECS '06.

* cited by examiner

*Primary Examiner* — Henry Choe
(74) *Attorney, Agent, or Firm* — Edward J. Lenart; H. Daniel Schnurmann; Biggers Kennedy Lenart Spraggins LLP

(57) ABSTRACT

Apparatuses for generating negative impedance compensation are provided. Embodiments include a differential amplifier having a first output and a second output; a capacitor coupled between the first output and the second output of the differential amplifier; a first negative impedance cross-coupled circuit having a first output and a second output; and a resistance control circuit coupled in series between the first output and the second output of the differential amplifier and the first output and the second output of the first negative impedance cross-coupled circuit.

9 Claims, 8 Drawing Sheets

//www.w3.org/1999/xhtml">
GENERATING NEGATIVE IMPEDANCE COMPENSATION

BACKGROUND OF THE INVENTION

1. Field of the Invention

The field of the invention is data processing, or, more specifically, methods and apparatuses for generating negative impedance compensation.

2. Description of Related Art

Negative impedance circuits are often used in conjunction with a main amplifier in order to cancel the parasitic load capacitance. Canceling a parasitic load capacitance limits the main amplifier bandwidth and thus provides bandwidth improvement. A simple negative impedance circuit involves two cross coupled transistors along with an impedance. The cross coupling of the two transistors creates a situation where a delta increase in voltage across the parasitic load impedance results in a delta current into the cross coupled transistors which is in the opposite sense with respect to the parasitic load impedance. The delta current flows through the impedance connected to the cross coupled transistors and "returns" back to the parasitic impedance. This creates the effect of "negative" impedance connected across the parasitic load impedance and thus cancelling/reducing the parasitic impedance.

When the negative impedance circuit is connected to the main amplifier, the negative capacitive reactance part partially cancels the positive capacitive reactance presented by the load capacitance CL. The partial cancellation is due to the presence of the negative resistance part introduced by the gm of the two cross coupled transistors. The partial cancellation has a negative impact on bandwidth.

SUMMARY

Methods and apparatuses for generating negative impedance compensation are provided. Embodiments include a differential amplifier having a first output and a second output; a capacitor coupled between the first output and the second output of the differential amplifier; a first negative impedance cross-coupled circuit having a first output and a second output; and a resistance control circuit coupled in series between the first output and the second output of the differential amplifier and the first output and the second output of the first negative impedance cross-coupled circuit.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
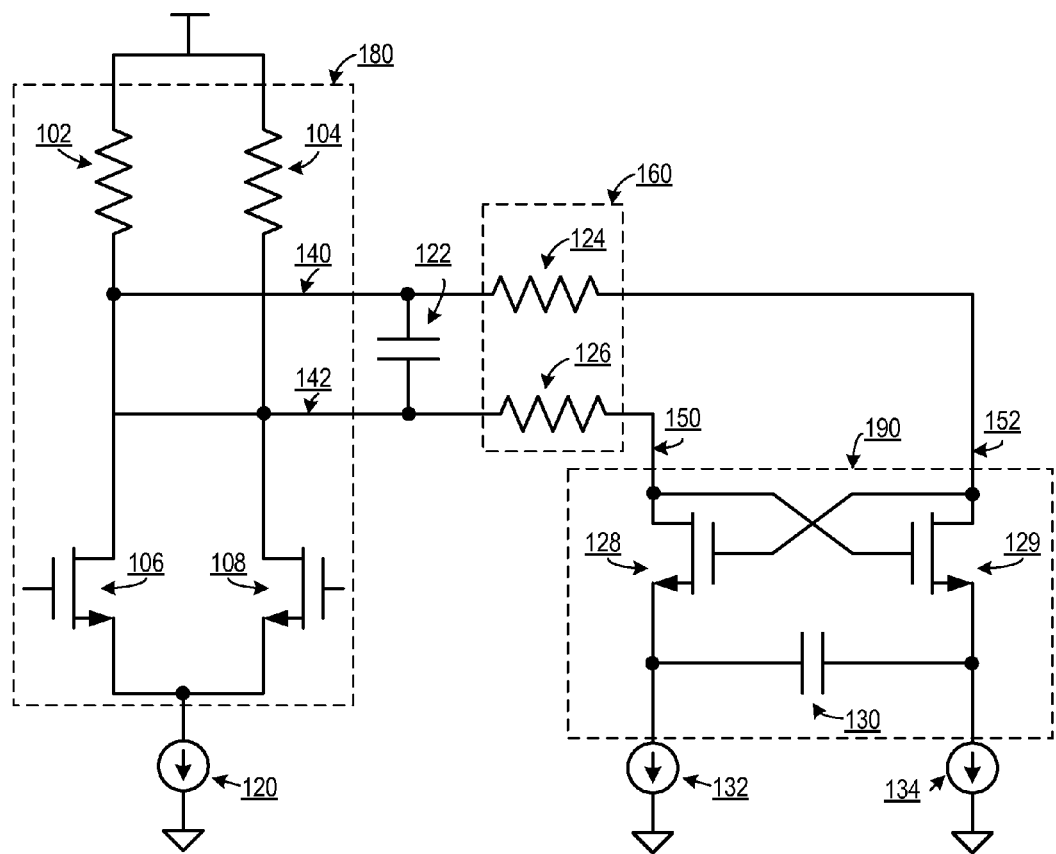
FIG. 1 sets forth an example of an apparatus for generating negative impedance compensation according to embodiments of the present invention.

Exemplary methods and apparatuses for generating negative impedance compensation in accordance with the present invention are described with reference to the accompanying drawings, beginning with FIG. 1. FIG. 1 sets forth an example of an apparatus for generating negative impedance compensation according to embodiments of the present invention. The apparatus of FIG. 1 includes a differential amplifier (180) having a first output (140) and a second output (142). In the example of FIG. 1, the differential amplifier (180) includes resistors (102, 104) and transistors (106, 108). A current source (120) may be coupled to an input of the differential amplifier (180). The first output (140) and the second output (142) of the differential amplifier (180) are coupled to a capacitor (122).

The apparatus of FIG. 1 also includes a first negative impedance cross-coupled circuit (190) having a first output (150) and a second output (152). In the example of FIG. 1, the first negative impedance cross-coupled circuit (190) includes a pair of cross-coupled transistors (128, 129) with a capacitor (130) coupled to their inputs.

The apparatus of FIG. 1 also includes a resistance control circuit (160) coupled in series between the first output (140) and the second output (142) of the differential amplifier (180) and the first output (150) and the second output (152) of the first negative impedance cross-coupled circuit (190). In the example of FIG. 1, the resistance control circuit includes a first resistor (124) coupled between the first output (140) of the differential amplifier (180) and the second output (152) of the first negative impedance cross-coupled circuit (190). The resistance control circuit (160) of FIG. 1 also includes a second resistor (126) coupled between the second output (142) of the differential amplifier (180) and the first output (150) of the first negative impedance cross-coupled circuit (190).

During operation, because the negative impedance cross-coupled circuit (190) is connected to the differential amplifier (180), the negative capacitance reactance part of the negative impedance circuit (190) partially cancels the positive capacitance reactance presented by the load capacitance (130). The partial cancellation is due to the presence of the negative resistance part introduced by the gm of the two cross coupled transistors. The resistance control circuit (160) acts to cancel this negative resistance part introduced by the gm of the two cross coupled transistors. Canceling the negative resistance leads to partial or complete cancellation of the parasitic capacitance at the load, thus leading to bandwidth improvement. That is, the real resistance of the resistance control circuit (160) completely or partially cancels the negative resistance introduced by the negative impedance cross-coupled circuit (190), thus completely or partially canceling the parasitic capacitance at the load.

Figure 2:
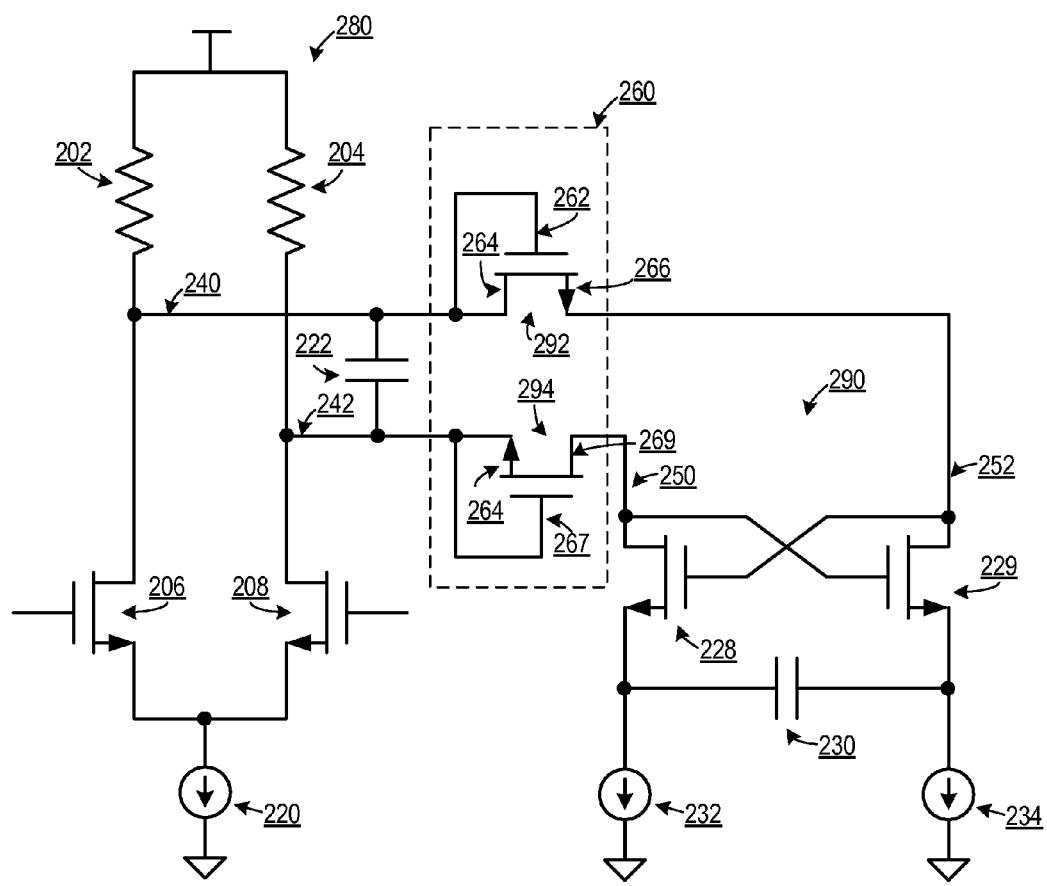
FIG. 2 sets forth another example of an apparatus for generating negative impedance compensation according to embodiments of the present invention.

For further explanation, FIG. 2 sets forth another example of an apparatus for generating negative impedance compensation according to embodiments of the present invention. The apparatus of FIG. 2 includes a differential amplifier (280) having a first output (240) and a second output (242). In the example of FIG. 2, the differential amplifier (280) includes resistors (202, 204) and transistors (206, 208). A current source (220) may be coupled to an input of the differential amplifier (280). The first output (240) and the second output (242) of the differential amplifier (280) are coupled to a capacitor (222).

The apparatus of FIG. 2 also includes a first negative impedance cross-coupled circuit (290) having a first output (250) and a second output (252). In the example of FIG. 2, the first negative impedance cross-coupled circuit (290) includes a pair of cross-coupled transistors (228, 229) with a capacitor (230) coupled to their inputs.

The apparatus of FIG. 2 also includes a resistance control circuit (260) coupled in series between the first output (240) and the second output (242) of the differential amplifier (280) and the first output (250) and the second output (252) of the first negative impedance cross-coupled circuit (290). In the example of FIG. 2, the resistance control circuit (260) includes a first transistor (292) and a second transistor (294). A drain terminal (264) of the first transistor (292) of FIG. 2 is coupled to the first output (240) of the differential amplifier (280) and a source terminal (266) of the first transistor (292) is coupled to the second output (252) of the first negative impedance cross-coupled circuit (290). In the example of FIG. 2, a drain terminal (269) of the second transistor (294) is coupled to second output (242) of the differential amplifier (280) and a source terminal (264) of the second transistor (294) is coupled to a first output (250) of the first negative impedance cross-coupled circuit (290).

During operation, because the negative impedance cross-coupled circuit (290) is connected to the differential amplifier (280), the negative capacitance reactance part of the negative impedance circuit (290) partially cancels the positive capacitance reactance presented by the load capacitance (230). The partial cancellation is due to the presence of the negative resistance part introduced by the gm of the two cross coupled transistors. The resistance control circuit (260) acts to cancel this negative resistance part introduced by the gm of the two cross coupled transistors. Canceling the negative resistance leads to partial or complete cancellation of the parasitic capacitance at the load, thus leading to bandwidth improvement. That is, the real resistance of the resistance control circuit (260) completely or partially cancels the negative resistance introduced by the negative impedance cross-coupled circuit (290), thus completely or partially canceling the parasitic capacitance at the load.

In comparing the operation of the apparatus of FIG. 1 to the apparatus of FIG. 2, Readers of skill in the art will realize that the transistors (292, 294) within the resistance control circuit (260) may require a larger voltage drop than the resistors (124, 126) of the resistance control circuit (160) of FIG. 1. A larger voltage drop across the transistors may limit the output swing of the apparatus of FIG. 2 in comparison to the output swing of the apparatus of FIG. 1. Also, the apparatus of FIG. 2 may be utilized with higher power supply voltages than the apparatus of FIG. 1.

Figure 3:
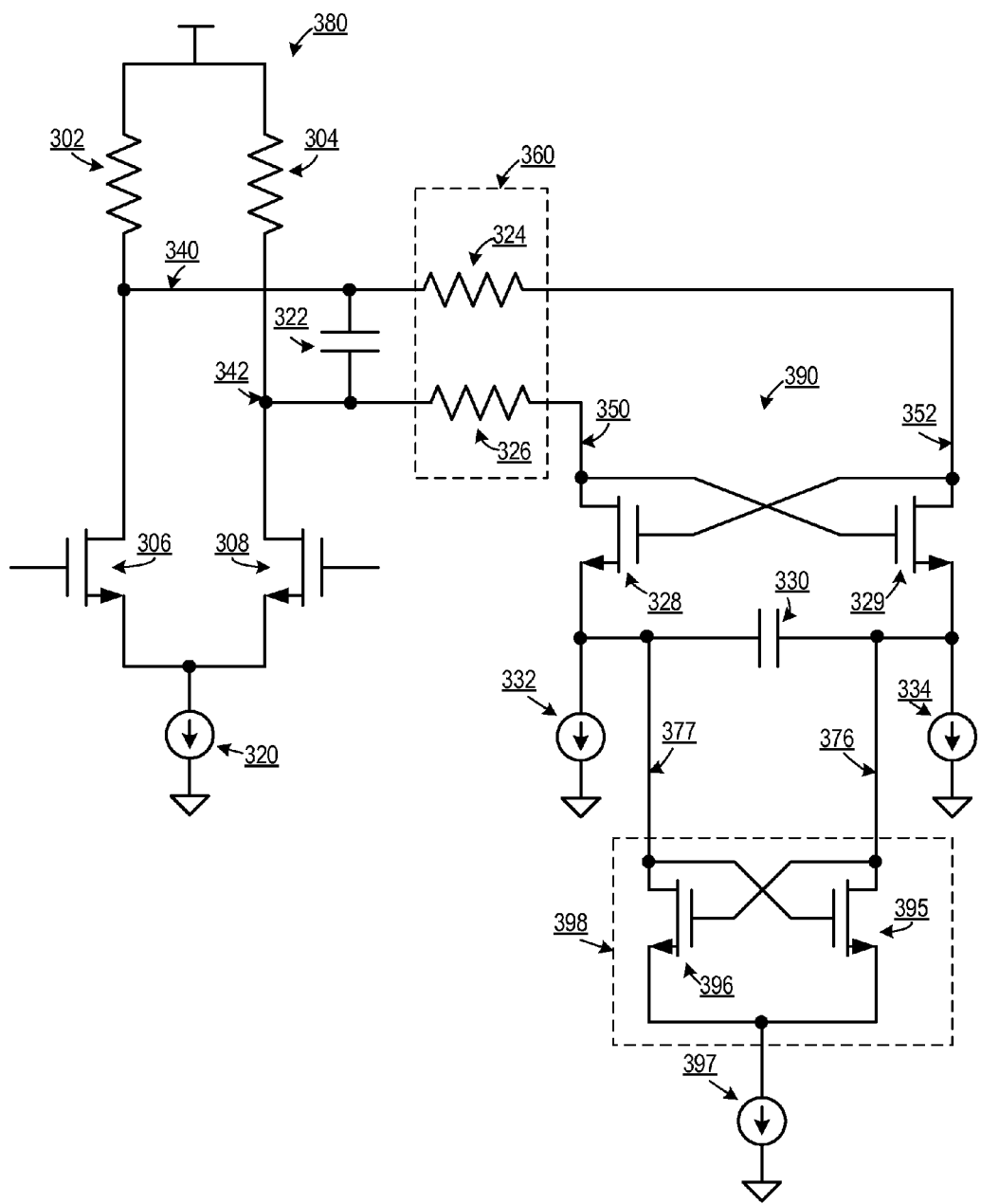
FIG. 3 sets forth another example of an apparatus for generating negative impedance compensation according to embodiments of the present invention.

For further explanation, FIG. 3 sets forth another example of an apparatus for generating negative impedance compensation according to embodiments of the present invention. The apparatus of FIG. 3 includes a differential amplifier (380) having a first output (340) and a second output (342). In the example of FIG. 3, the differential amplifier (380) includes resistors (302, 304) and transistors (306, 308). A current source (320) may be coupled to an input of the differential amplifier (380). The first output (340) and the second output (342) of the differential amplifier (380) are coupled to a capacitor (322).

The apparatus of FIG. 3 also includes a first negative impedance cross-coupled circuit (390) having a first output (350) and a second output (352). In the example of FIG. 3, the first negative impedance cross-coupled circuit (390) includes a pair of cross-coupled transistors (328, 329) with a capacitor (330) coupled to their inputs.

The apparatus of FIG. 3 also includes a resistance control circuit (360) coupled in series between the first output (340) and the second output (342) of the differential amplifier (380) and the first output (350) and the second output (352) of the first negative impedance cross-coupled circuit (390). In the example of FIG. 3, the resistance control circuit (360) includes a first resistor (324) coupled between the first output (340) of the differential amplifier (380) and the second output (352) of the first negative impedance cross-coupled circuit (390). The resistance control circuit (360) of FIG. 3 also includes a second resistor (326) coupled between the second output (342) of the differential amplifier (380) and the first output (350) of the first negative impedance cross-coupled circuit (390).

The apparatus of FIG. 3 also includes a second negative impedance cross-coupled circuit (398) having a first output (377) and a second output (376). In the example of FIG. 3, the second negative impedance cross-coupled circuit (398) includes a pair of cross-coupled transistors (396, 395) with a current source (397) coupled to their inputs. The first output (377) and the second output (376) of the second negative impedance cross-coupled circuit (398) is coupled to the capacitor (330) of the first negative impedance cross-coupled circuit (390).

During operation, because the negative impedance cross-coupled circuit (390) is connected to the differential amplifier (380), the negative capacitance reactance part of the negative impedance circuit (390) partially cancels the positive capacitance reactance presented by the load capacitance (330). The partial cancellation is due to the presence of the negative resistance part introduced by the gm of the two cross coupled transistors. The resistance control circuit (360) acts to cancel this negative resistance part introduced by the gm of the two cross coupled transistors.

In the example of FIG. 3, the second negative impedance cross-coupled circuit (398) is coupled in parallel to the load capacitance (330). The parallel 1/gm load across the load capacitor (330) at one frequency can be considered as a series combination of a negative resistance and a capacitance which in turn is negated again by the transistor (328, 329) of the first negative impedance cross-coupled circuit (390). The negative resistance is converted to a positive resistance, which partially cancels the −1/gm resistance of the cross-coupled transistors (328, 329) of the first negative impedance cross-coupled circuit (390). Since the cancellation is only partial the first negative impedance cross-coupled circuit (390) can also have another series resistance which can be used to further cancel the residual negative resistance. The addition of parallel negative resistance of the second negative impedance cross-coupled circuit (398) to the load capacitor (330) may have an added advantage from a High Speed Serdes (HSS) application point of view. Since the negative resistance of the second negative impedance cross-coupled circuit (398) cancels the negative resistance of the first negative impedance cross-coupled circuit (390) only partially, the overall load resistance can be reduced at low frequencies. The apparatus of FIG. 3 can thus be used to construct an amplifier that introduces peaking. This can be beneficial in a HSS type of application. The resistors (324, 326) of the resistance control circuit (360) control both the low frequency gain as well as bandwidth. Increasing the resistors (324, 326) of the resistance control circuit (360) increases the low frequency gain and improves the bandwidth of the apparatus.

Figure 4:
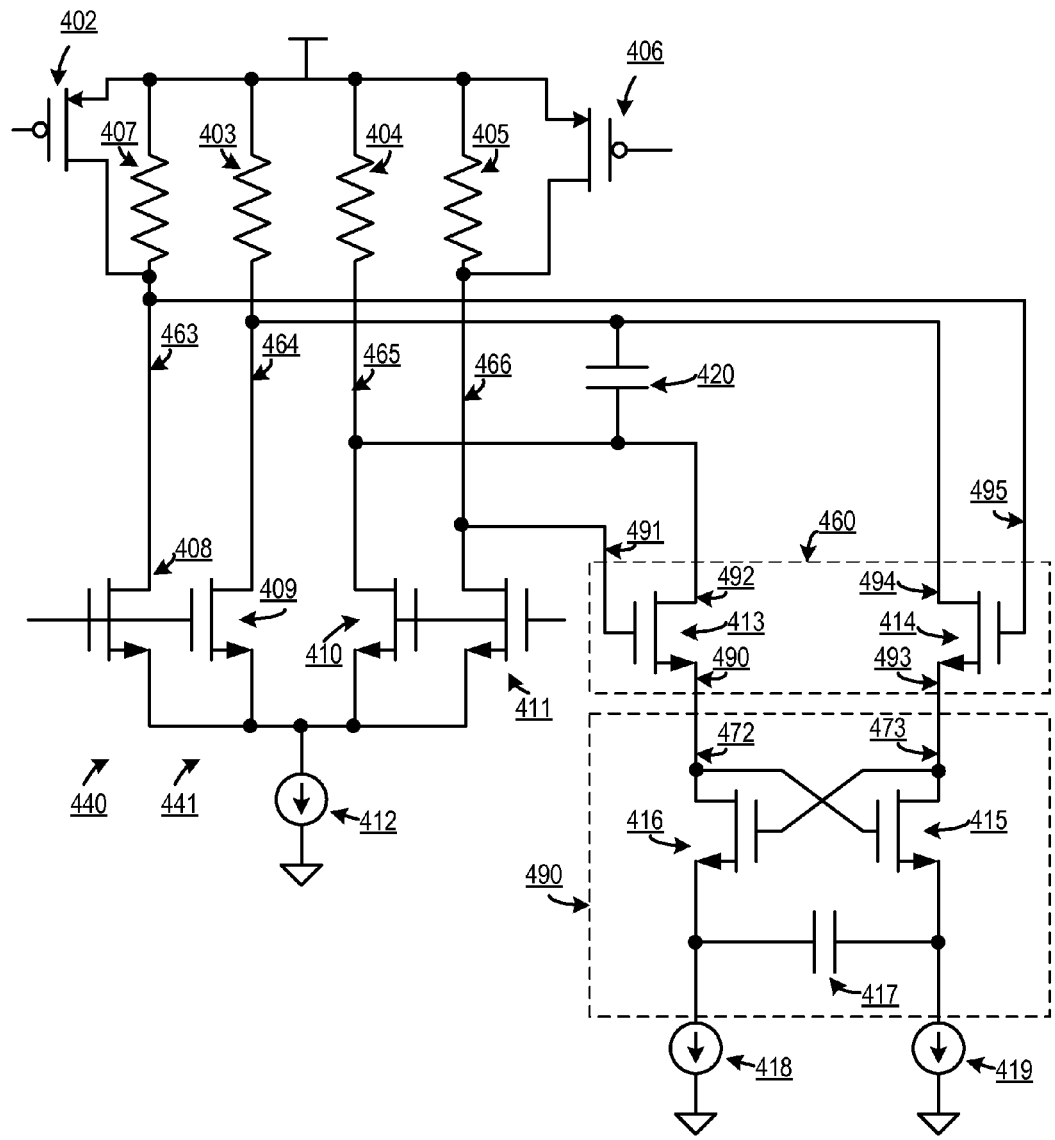
FIG. 4 sets forth another example of an apparatus for generating negative impedance compensation according to embodiments of the present invention.

For further explanation, FIG. 4 sets forth another example of an apparatus for generating negative impedance compensation according to embodiments of the present invention. The apparatus of FIG. 4 includes a first differential amplifier (441) having a first output (464) and a second output (465). In the example of FIG. 4, the first differential amplifier (441) includes resistors (403, 404) and transistors (409, 410). A current source (412) may be coupled to an input of the first differential amplifier (441). The first output (464) and the second output (465) of the first differential amplifier (441) are coupled to a capacitor (420).

The apparatus of FIG. 4 also includes a second differential amplifier (440) having a first output (463) and a second output (466). In the example of FIG. 4, the second differential amplifier (440) includes resistors (407, 405) and transistors (408, 411). The current source (412) may be coupled to an input of the second differential amplifier (440).

The apparatus of FIG. 4 also includes a first negative impedance cross-coupled circuit (490) having a first output (472) and a second output (473). In the example of FIG. 4, the first negative impedance cross-coupled circuit (490) includes a pair of cross-coupled transistors (416, 415) with a load capacitor (417) coupled to their inputs.

The apparatus of FIG. 4 also includes a resistance control circuit (460) coupled in series between the first output (464) and the second output (465) of the first differential amplifier (441). In the example of FIG. 4, the resistance control circuit (460) includes a first transistor (414) and a second transistor (413). A drain terminal (494) of the first transistor (414) is coupled to a first output (464) of the first differential amplifier (441) and a source terminal (493) of the first transistor (414) coupled to a second output (473) of the first negative impedance cross-coupled circuit (490). A drain terminal (492) of the second transistor (413) is coupled to the second output (465) of the first differential amplifier (441) and a source terminal (490) of the second transistor (413) is coupled to the first output (472) of the first negative impedance cross-coupled circuit (490). The second output (465) of the second differential amplifier (440) is coupled to a gate terminal (491) of the second transistor (414) and the first output (463) of the second differential amplifier (440) is coupled to a gate terminal (495) of the first transistor (414).

During operation, because the negative impedance cross-coupled circuit (190) is connected to the differential amplifier (180), the negative capacitance reactance part of the negative impedance circuit (190) partially cancels the positive capacitance reactance presented by the load capacitance (130). The partial cancellation is due to the presence of the negative resistance part introduced by the gm of the two cross coupled transistors. The resistance control circuit (160) acts to cancel this negative resistance part introduced by the gm of the two cross coupled transistors. Canceling the negative resistance leads to partial or complete cancellation of the parasitic capacitance at the load, thus leading to bandwidth improvement. That is, the real resistance of the resistance control circuit (160) completely or partially cancels the negative resistance introduced by the negative impedance cross-coupled circuit (190), thus completely or partially canceling the parasitic capacitance at the load.

In the example of FIG. 4, the gate terminals (491, 495) and the drain terminals (492, 494) of the first transistor (414) and the second transistor (413) are uncoupled and are driven separately. In a particular embodiment, the sizing of the transistors (408, 411) of the second differential amplifier (440) with respect to the transistors (409, 410) of the first differential amplifier (441) are selected such that the transistors (409, 410) the second differential amplifier (440) carry only a fraction of the current in the transistors (409, 410) of the first differential amplifier (441). During operation, gains of the first differential amplifier (441) and the second differential amplifier (440) however are maintained to be the same. This allows the gate and drain of the first transistor (414) and the second transistor (413) of the resistance control circuit (460) to track. However since the transistors (414, 413) are uncoupled, they can operate at different common mode voltages.

In addition, the gate of the transistors (414, 413) of the resistance control circuit (460) are now driven by the outputs (463, 466) of the second differential amplifier (440) while the drain nodes of the transistors (414, 413 of the resistance control circuit (460) continue to be connected to the outputs (464, 465) of the first differential amplifier (441). Uncoupling of the gate and drain allows the drain node to move independently of the gate. The sizing of transistors (413, 414) of the resistance control circuit (460) with respect to the cross-coupled transistors (416, 415) of the negative impedance cross-coupled circuit (490) may be selected such that the gm of the two pairs track each other over process, voltage and temperature. The second differential amplifier (440) also includes additional transistor (402, 406) that enable the common mode of the second differential amplifier (440) to be set somewhat independent of the AC gain.

Figure 5:
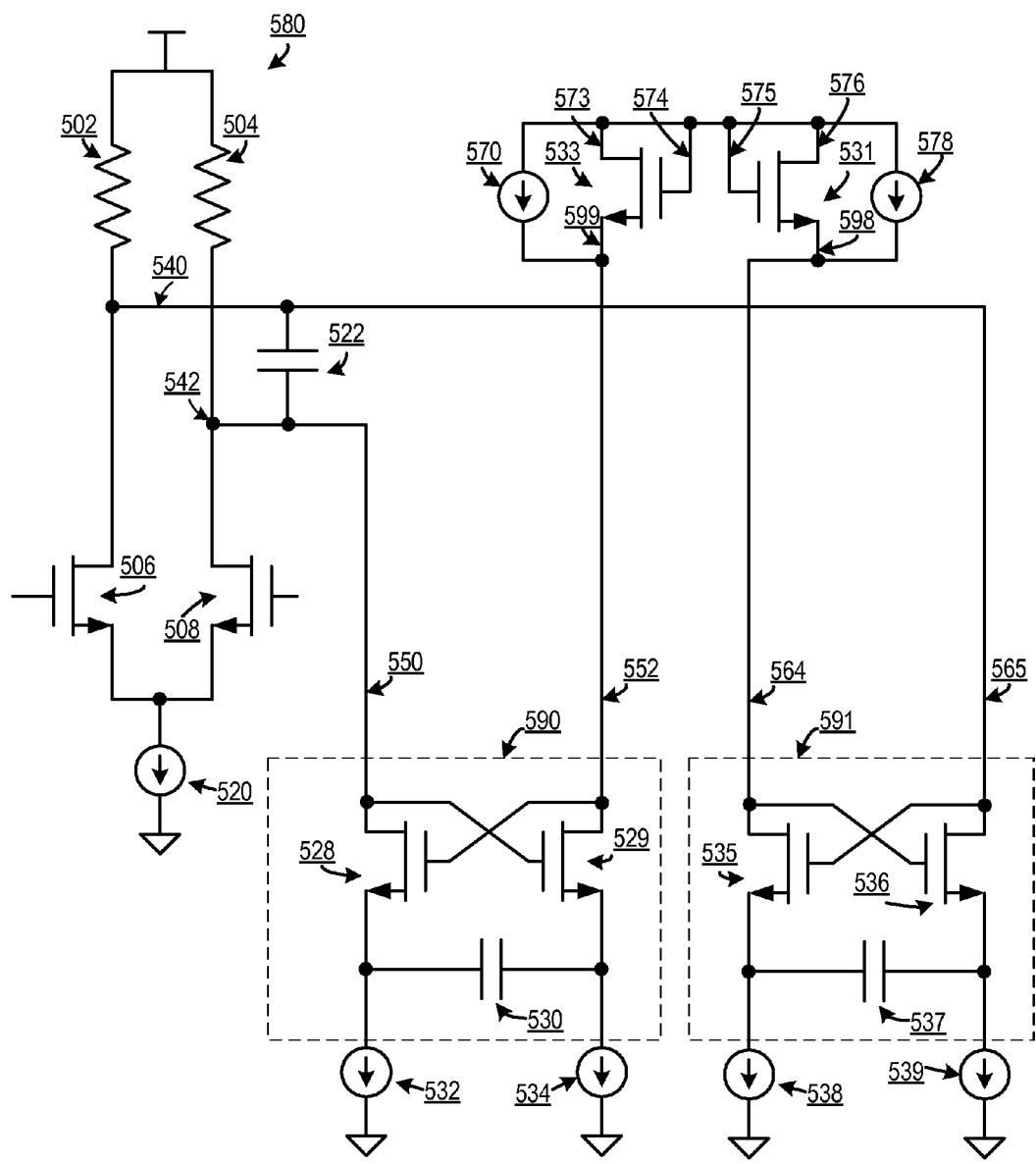
FIG. 5 sets forth another example of an apparatus for generating negative impedance compensation according to embodiments of the present invention.

For further explanation, FIG. 5 sets forth another example of an apparatus for generating negative impedance compensation according to embodiments of the present invention. The apparatus of FIG. 5 includes a differential amplifier (580) having a first output (540) and a second output (542). In the example of FIG. 5, the differential amplifier (580) includes resistors (502, 504) and transistors (506, 508). A current source (520) may be coupled to an input of the differential amplifier (580). The first output (540) and the second output (542) of the differential amplifier (580) are coupled to a capacitor (522).

The apparatus of FIG. 5 also includes a first negative impedance cross-coupled circuit (590) having a first output (550) and a second output (552). In the example of FIG. 5, the first negative impedance cross-coupled circuit (590) includes a pair of cross-coupled transistors (528, 529) with a capacitor (530) coupled to their inputs, which are coupled to input sources (531, 534).

The apparatus of FIG. 5 also includes a second negative impedance cross-coupled circuit (591) having a first output (564) and a second output (565). In the example of FIG. 5, the second negative impedance cross-coupled circuit (591) includes a pair of cross-coupled transistors (535, 536) with a capacitor (537) coupled to their inputs, which are coupled to input sources (538, 539).

The apparatus of FIG. 5 also includes a first transistor (533) and a second transistor (531). A source terminal (599) of the first transistor (533) is coupled to a second output (552) of the first negative impedance cross-coupled circuit (590) and a drain terminal (573) of the first transistor (533) is coupled to a gate terminal (574) of the first transistor (533). A source terminal (598) of the second transistor (531) is coupled to the first output (564) of the second negative impedance cross-coupled circuit (591) and a drain terminal (576) of the second transistor (531) is coupled to a gate terminal (575) of the second transistor (531).

During operation, each negative impedance cross-coupled circuit (590, 591) injects a voltage into the negative capacitance loop to exactly cancel out the voltage drops that appear across the two 1/gm series resistances in the loop. The transistors (533, 531) are biased independent of the first differential amplifier (580) and the transistors (528, 535) connected to the first differential amplifier (580). In a particular embodiment, the transistors (533, 531) are sized in such a way that the transconductance of the transistors (533, 531) is equal to the addition of the transconductance of the first negative impedance cross-coupled circuit (590) and the transconductance of the second negative impedance cross-coupled circuit (591).

Figure 6:
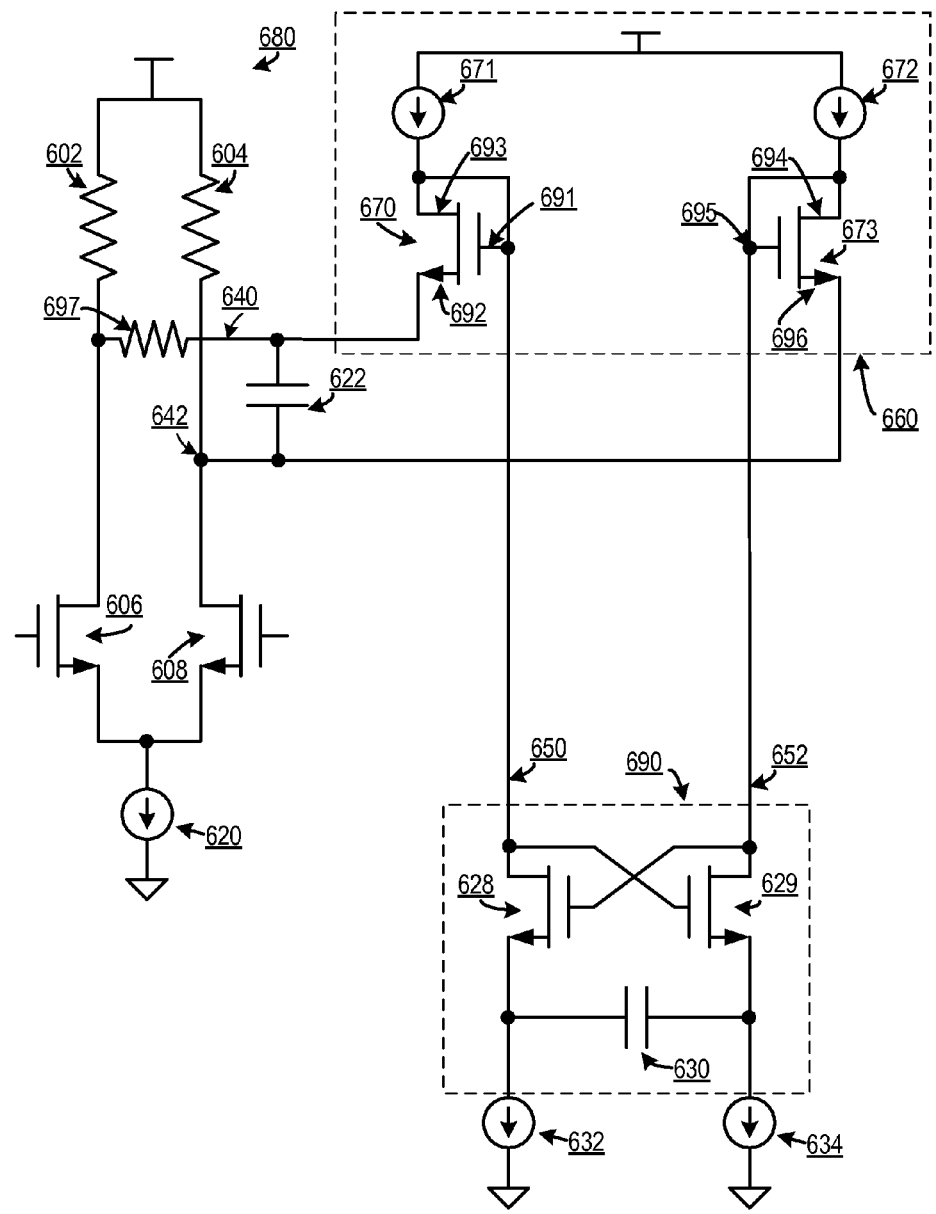
FIG. 6 sets forth another example of an apparatus for generating negative impedance compensation according to embodiments of the present invention.

For further explanation, FIG. 6 sets forth another example of an apparatus for generating negative impedance compensation according to embodiments of the present invention. The apparatus of FIG. 6 includes a differential amplifier (680) having a first output (640) and a second output (642). In the example of FIG. 6, the differential amplifier (680) includes resistors (602, 604, 697) and transistors (606, 608). A current source (620) may be coupled to an input of the differential amplifier (680). The first output (640) and the second output (642) of the differential amplifier (680) are coupled to a capacitor (622).

The apparatus of FIG. 6 also includes a first negative impedance cross-coupled circuit (690) having a first output (650) and a second output (652). In the example of FIG. 6, the first negative impedance cross-coupled circuit (690) includes a pair of cross-coupled transistors (628, 629) with a capacitor (630) coupled to their inputs, which are coupled to input sources (632, 634).

The apparatus of FIG. 6 also includes a resistance control circuit (660) coupled in series between the first output (640) and the second output (642) of the differential amplifier (680) and the first output (650) and the second output (652) of the first negative impedance cross-coupled circuit (690). In the example of FIG. 6, the resistance control circuit (660) includes a first transistor (670) and a second transistor (673). A source terminal (692) of the first transistor (670) is coupled to the first output (640) of the differential amplifier (680) and a gate terminal (691) of the first transistor (670) is coupled to the first output (650) of the first negative impedance cross-coupled circuit (690). A source terminal (696) of the second transistor (673) is coupled to the second output (652) of the differential amplifier (680) and a gate terminal (695) of the second transistor (673) is coupled to the second output (652) of the negative impedance cross-coupled circuit (690).

During operation, because the negative impedance cross-coupled circuit (690) is connected to the differential amplifier (680), the negative capacitance reactance part of the negative impedance circuit (690) partially cancels the positive capacitance reactance presented by the load capacitance (630). The partial cancellation is due to the presence of the negative resistance part introduced by the gm of the two cross coupled transistors. The resistance control circuit (660) acts to cancel this negative resistance part introduced by the gm of the two cross coupled transistors. Canceling the negative resistance leads to partial or complete cancellation of the parasitic capacitance at the load, thus leading to bandwidth improvement. That is, the real resistance of the resistance control circuit (660) completely or partially cancels the negative resistance introduced by the negative impedance cross-coupled circuit (690), thus completely or partially canceling the parasitic capacitance at the load.

In the example of FIG. 6, sources (671, 672) are used to bias the transistors (670, 673) of the resistance control circuit (660). In a particular embodiment, the resistors (602, 604) are sized to be larger than resistor (697), thus allowing the output common mode of the differential amplifier (680) to be set lower and allow the first transistor (670) to be biased by the source (671). This approach may improve the available bandwidth when compared to the apparatus of FIG. 2.

Figure 7:
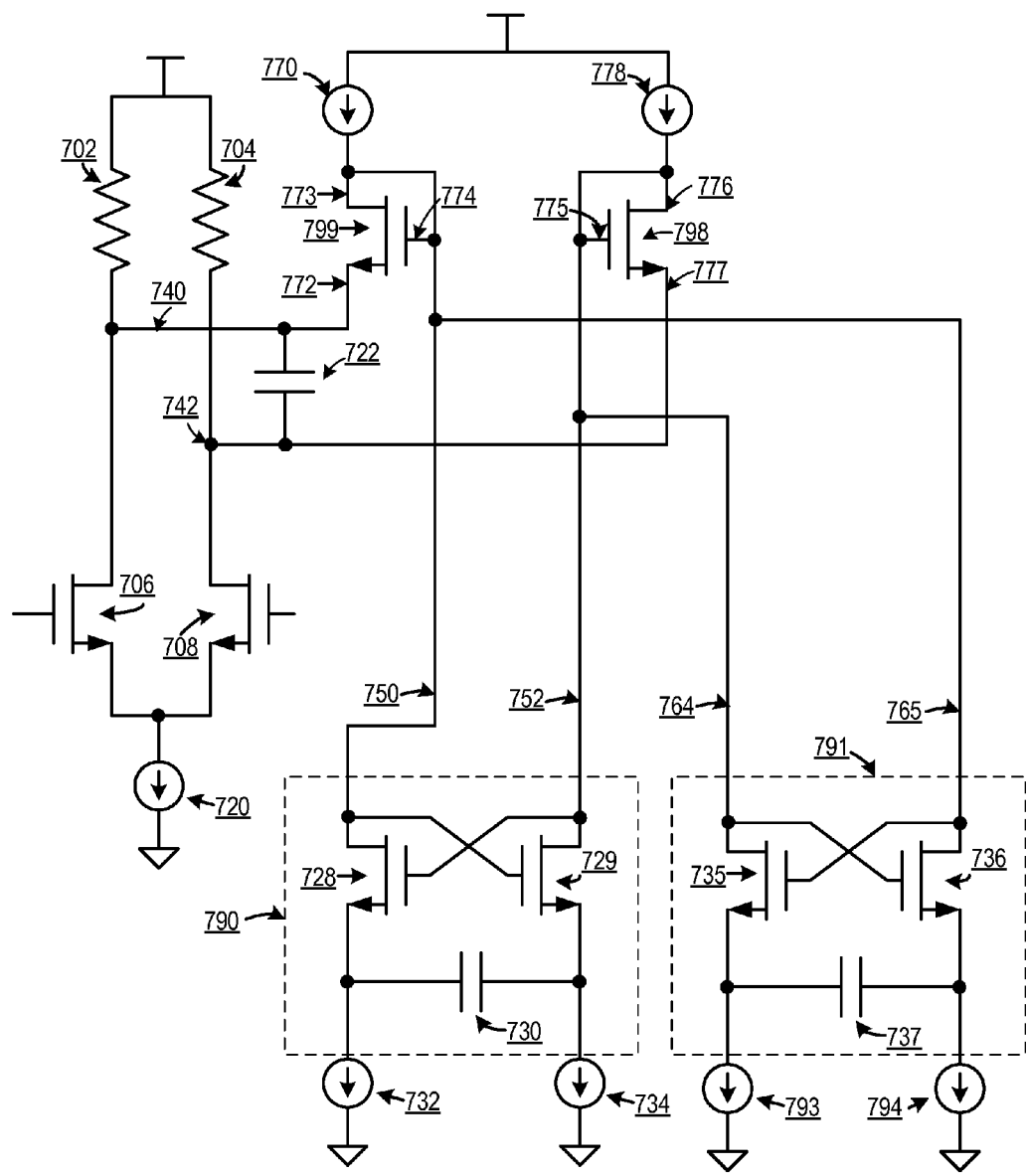
FIG. 7 sets forth another example of an apparatus for generating negative impedance compensation according to embodiments of the present invention.

For further explanation, FIG. 7 sets forth another example of an apparatus for generating negative impedance compensation according to embodiments of the present invention. The apparatus of FIG. 7 includes a differential amplifier (780) having a first output (740) and a second output (742). In the example of FIG. 7, the differential amplifier (780) includes resistors (702, 704, 797) and transistors (706, 708). A current source (720) may be coupled to an input of the differential amplifier (780). The first output (740) and the second output (742) of the differential amplifier (780) are coupled to a capacitor (722).

The apparatus of FIG. 7 also includes a first negative impedance cross-coupled circuit (790) having a first output (750) and a second output (752). In the example of FIG. 7, the first negative impedance cross-coupled circuit (790) includes a pair of cross-coupled transistors (728, 729) with a capacitor (730) coupled to their inputs, which are coupled to input sources (732, 734).

The apparatus of FIG. 7 also includes a second negative impedance cross-coupled circuit (791) having a first output (764) and a second output (765). In the example of FIG. 7, the second negative impedance cross-coupled circuit (791) includes a pair of cross-coupled transistors (735, 736) with a capacitor (737) coupled to their inputs, which are coupled to input sources (738, 739). The first output (764) of the second negative impedance cross-coupled circuit (791) is coupled to the second output (752) of the first negative impedance cross-coupled circuit (790). The second output (765) of the second negative impedance cross-coupled circuit (791) is coupled to the first output (750) of the first negative impedance cross-coupled circuit (790).

The apparatus of FIG. 7 also includes a resistance control circuit (760) coupled in series between the first output (740) and the second output (742) of the differential amplifier (780) and the first output (750) and the second output (752) of the first negative impedance cross-coupled circuit (790). In the example of FIG. 7, the resistance control circuit (760) includes a first transistor (770) and a second transistor (773). A source terminal (792) of the first transistor (770) is coupled to the first output (740) of the differential amplifier (780) and a gate terminal (791) of the first transistor (770) is coupled to the first output (750) of the first negative impedance cross-coupled circuit (790). A source terminal (796) of the second transistor (773) is coupled to the second output (752) of the differential amplifier (780) and a gate terminal (795) of the second transistor (773) is coupled to the second output (752) of the first negative impedance cross-coupled circuit (790).

During operation, because the negative impedance cross-coupled circuits (790, 791) are connected to the differential amplifier (780), the negative capacitance reactance part of the negative impedance circuits (790, 791) partially cancels the positive capacitance reactance presented by the load capacitance (730). The partial cancellation is due to the presence of the negative resistance part introduced by the gm of the two cross coupled transistors. The resistance control circuit (760) acts to cancel this negative resistance part introduced by the gm of the two cross coupled transistors. Canceling the negative resistance leads to partial or complete cancellation of the parasitic capacitance at the load, thus leading to bandwidth improvement. That is, the real resistance of the resistance control circuit (760) completely or partially cancels the negative resistance introduced by the negative impedance cross-coupled circuit (790), thus completely or partially canceling the parasitic capacitance at the load.

Figure 8:
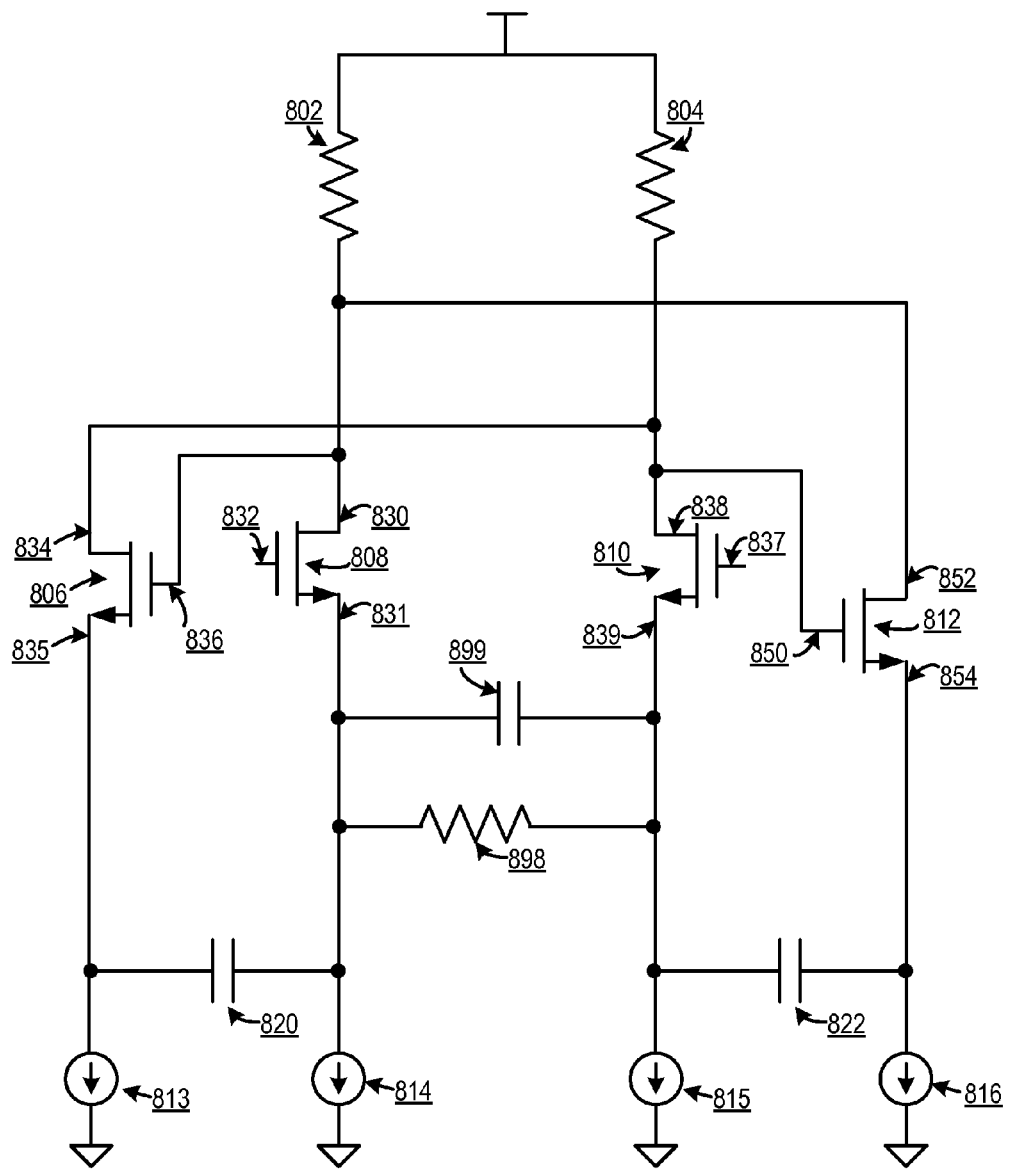
FIG. 8 sets forth another example of an apparatus for generating negative impedance compensation according to embodiments of the present invention.

For further explanation, FIG. 8 sets forth another example of an apparatus for generating negative impedance compensation according to embodiments of the present invention. The apparatus of FIG. 8 includes a first transistor (806) and a second transistor (810). A drain terminal (834) of the first transistor (806) is coupled to a gate terminal (850) of the second transistor (812) and a gate terminal (836) of the first transistor (806) is coupled to a drain terminal (852) of the second transistor (812).

The apparatus of FIG. 8 also includes a third transistor (808) and a fourth transistor (810). A drain terminal (830) of the third transistor (808) is coupled to the gate terminal (836) of the first transistor (806). A drain terminal (850) of the fourth transistor (812) is coupled to a gate terminal (850) of the second transistor (812).

In the example of FIG. 8, a first capacitor (820) is coupled between a source terminal (835) of the first transistor (806) and a source terminal (831) of the third transistor (808). A second capacitor (822) is coupled between a source terminal (839) of the fourth transistor (810) and a source terminal (854) of the second transistor (812). A third capacitor (899) is coupled between a source terminal (831) of the third transistor (808) and a source terminal (839) of the fourth transistor (810). A third resistor (898) is also coupled between a source terminal (831) of the third transistor (808) and a source terminal (839) of the fourth transistor (810).

During operation, the apparatus of FIG. 8 may be used to reduce the power dissipation of a negative impedance cross-coupled circuit. In a particular embodiment, a traditional negative impedance cross-coupled circuit may have a ration between the current in the differential amplifier and the negative impedance cross-coupled circuit is ⅒, while the apparatus of FIG. 8 allows drawings ¹⁄₂₀ the power with respect to the differential amplifier with the same performance. Reducing the power may allow reduction in the cross-coupled transistor sizes and provide a bandwidth advantage.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for generating negative impedance compensation, the apparatus comprising:
    a differential amplifier having a first output and a second output;
    a capacitor coupled between the first output and the second output of the differential amplifier;
    a first negative impedance cross-coupled circuit having a first output and a second output; and
    a resistance control circuit coupled in series between the first output and the second output of the differential amplifier and the first output and the second output of the first negative impedance cross-coupled circuit.

2. The apparatus of claim 1 wherein the resistance control circuit includes:
    a first resistor coupled between the first output of the differential amplifier and the second output of the first negative impedance cross-coupled circuit; and
    a second resistor coupled between the second output of the differential amplifier and the first output of the first negative impedance cross-coupled circuit.

3. The apparatus of claim 1 wherein the resistance control circuit includes:
    a first transistor, a drain terminal of the first transistor coupled to a first output of the differential amplifier and a source terminal of the first transistor coupled to a second output of the first negative impedance cross-coupled circuit; and
    a second transistor, a drain terminal of the second transistor coupled to second output of the differential amplifier and a source terminal of the second transistor coupled to a first output of the first negative impedance cross-coupled circuit.

4. The apparatus of claim 1 wherein the first negative impedance circuit includes a first input and a second input; the apparatus further comprising a second negative impedance circuit having a first output and a second output; the first output of the second negative impedance circuit coupled to the first input of the first negative impedance circuit; and the second output of the second negative impedance circuit coupled to the second input of the first negative impedance circuit.

5. The apparatus of claim 1 wherein the resistance control circuit includes:
    a first transistor, a source terminal of the first transistor coupled to the first output of the negative impedance cross-coupled circuit and a drain terminal of the first transistor coupled to the second output of the differential amplifier; and
    a second transistor, a source terminal of the second transistor coupled to the second output of the first negative impedance cross-coupled circuit and a drain terminal of the second transistor coupled to the first output of the differential amplifier; and
    the apparatus further comprising a second differential amplifier, a first output of the second differential amplifier coupled to a gate terminal of the second transistor and a second output of the second differential amplifier coupled to a gate terminal of the first transistor.

6. The apparatus of claim 1 wherein the resistance control circuit includes:
    a first transistor, a source terminal of the first transistor coupled to the first output of the differential amplifier and a gate terminal of the first transistor coupled to the first output of the first negative impedance cross-coupled circuit; and
    a second transistor, a source terminal of the second transistor coupled to the second output of the differential amplifier and a gate terminal of the second transistor coupled to the second output of the first negative impedance cross-coupled circuit.

7. The apparatus of claim 6 further comprising a second negative impedance cross-coupled circuit; a first output of the second negative impedance cross-coupled circuit coupled to the second output of the first negative impedance cross-coupled circuit; and a second output of the second negative impedance cross-coupled circuit coupled to the first output of the first negative impedance cross-coupled circuit.

8. The apparatus of claim 1 wherein the negative impedance circuit includes a pair of cross coupled transistors.

9. The apparatus of claim 1 wherein the differential amplifier includes two transistors coupled to two resistors.

* * * * *